(12) United States Patent
Cheng et al.

(10) Patent No.: US 9,997,540 B2
(45) Date of Patent: Jun. 12, 2018

(54) STRUCTURE AND METHOD FOR COMPRESSIVELY STRAINED SILICON GERMANIUM FINS FOR PFET DEVICES AND TENSILY STRAINED SILICON FINS FOR NFET DEVICES

(71) Applicant: International Business Machines Corporation, Armonk, NY (US)

(72) Inventors: Kangguo Cheng, Schenectady, NY (US); Bruce B. Doris, Slingerlands, NY (US); Ali Khakifirooz, Los Altos, CA (US); Darsen D. Lu, Mount Kisco, NY (US); Alexander Reznicek, Troy, NY (US); Kern Rim, San Diego, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days. days.

(21) Appl. No.: 15/407,992

(22) Filed: Jan. 17, 2017

(65) Prior Publication Data

US 2017/0125447 A1 May 4, 2017

Related U.S. Application Data

(62) Division of application No. 14/840,960, filed on Aug. 31, 2015, now Pat. No. 9,548,386.

(51) Int. Cl.
| | |
|---|---|
| *H01L 27/12* | (2006.01) |
| *H01L 29/78* | (2006.01) |
| *H01L 27/092* | (2006.01) |
| *H01L 29/10* | (2006.01) |
| *H01L 29/165* | (2006.01) |

(Continued)

(52) U.S. Cl.
CPC .... *H01L 27/1211* (2013.01); *H01L 21/02532* (2013.01); *H01L 21/02636* (2013.01); *H01L 21/308* (2013.01); *H01L 21/31116* (2013.01); *H01L 21/32* (2013.01); *H01L 21/324* (2013.01); *H01L 21/845* (2013.01); *H01L 27/0924* (2013.01); *H01L 29/1054* (2013.01); *H01L 29/165* (2013.01); *H01L 29/66795* (2013.01);

(Continued)

(58) Field of Classification Search
CPC ............. H01L 29/7845; H01L 29/7842; H01L 27/1211; H01L 27/165
See application file for complete search history.

(56) References Cited

U.S. PATENT DOCUMENTS

| | | | |
|---|---|---|---|
| 7,198,995 B2 | 4/2007 | Chidambarrao et al. | |
| 8,211,772 B2 | 7/2012 | Kavalieros et al. | |

(Continued)

OTHER PUBLICATIONS

List of IBM Patents or Patent Applications Treated as Related dated Jan. 17, 2017, 2 Pages.
U.S. Appl. No. 14/840,960, filed Aug. 31, 2015.

*Primary Examiner* — Amar Movva
(74) *Attorney, Agent, or Firm* — Scully, Scott, Murphy & Presser, P.C.; Daniel P. Morris, Esq.

(57) ABSTRACT

A method of forming a semiconductor structure that includes a tensily strained silicon fin extending upwards from a first portion of a substrate and in an nFET device region, and a SiGe fin structure extending upwards from a second portion of the substrate and in a pFET device region. In accordance with the present application, the SiGe fin structure comprises, from bottom to top, a lower SiGe fin that is relaxed and an upper SiGe fin, wherein the upper SiGe fin is compressively strained and has a germanium content that is greater than a germanium content of the lower SiGe fin.

17 Claims, 5 Drawing Sheets

(51) Int. Cl.
    *H01L 29/66*     (2006.01)
    *H01L 21/84*     (2006.01)
    *H01L 21/02*     (2006.01)
    *H01L 21/308*    (2006.01)
    *H01L 21/311*    (2006.01)
    *H01L 21/32*     (2006.01)
    *H01L 21/324*    (2006.01)

(52) U.S. Cl.
    CPC ........ *H01L 29/785* (2013.01); *H01L 29/7842* (2013.01)

(56) References Cited

U.S. PATENT DOCUMENTS

| | | |
|---|---|---|
| 8,445,963 B2 | 5/2013 | Jakschik et al. |
| 8,558,279 B2 | 10/2013 | Cea et al. |
| 8,575,727 B2 | 11/2013 | Lim et al. |
| 2012/0241818 A1 | 9/2012 | Kavallieros et al. |
| 2012/0319211 A1 | 12/2012 | Van Dal et al. |
| 2013/0200459 A1 | 8/2013 | Adam et al. |

STRUCTURE AND METHOD FOR COMPRESSIVELY STRAINED SILICON GERMANIUM FINS FOR PFET DEVICES AND TENSILY STRAINED SILICON FINS FOR NFET DEVICES

BACKGROUND

The present application relates to semiconductor technology and more particularly to a method of forming tensily strained silicon fins in an nFET device region and compressively strained silicon germanium alloy (SiGe) fins in a pFET device region. The present application also relates to a semiconductor structure containing tensily strained silicon fins in an nFET device region and compressively strained silicon germanium alloy (SiGe) fins in a pFET device region.

For more than three decades, the continued miniaturization of metal oxide semiconductor field effect transistors (MOSFETs) has driven the worldwide semiconductor industry. Various showstoppers to continue scaling have been predicated for decades, but a history of innovation has sustained Moore's Law in spite of many challenges. However, there are growing signs today that MOSFETs are beginning to reach their traditional scaling limits. Since it has become increasingly difficult to improve MOSFETs and therefore complementary metal oxide semiconductor (CMOS) performance through continued scaling, further methods for improving performance in addition to scaling have become critical.

The use of non-planar semiconductor devices such as, for example, semiconductor fin field effect transistors (FinFETs) is the next step in the evolution of complementary metal oxide semiconductor (CMOS) devices. Semiconductor FinFETs can achieve higher drive currents with increasingly smaller dimensions as compared to conventional planar FETs.

For FinFET performance increase, a strained channel material is needed. For CMOS devices, tensile strained silicon fins are beneficial for nFET devices, but not for pFET devices. Therefore, there is a need to release tensile strain in the pFET fins and also to add compressive strain to the pFET fins for further device performance enhancement.

SUMMARY

The present application provides a method to maintain strain in an nFET device region of a strained silicon-on-insulator (SSOI) substrate, while forming compressively strained silicon germanium alloy (SiGe) fins in a pFET device region.

In one aspect of the present application, a method of forming a semiconductor structure is provided. In one embodiment, the method includes forming a hard mask on a portion of a strained silicon layer of a strained silicon-on-insulator substrate. In accordance with the present application, the hard mask is located within an nFET device region. A portion of the strained silicon layer within a pFET device region is then recessed to expose a sub-surface of the strained silicon layer in the pFET device region. Next, a first SiGe layer having a first Ge content is formed on the sub-surface of the strained silicon layer in the pFET device region. A thermal condensation process is then performed to convert the strained silicon layer in the pFET device region into a second SiGe layer having the first Ge content and being relaxed. Next, a third SiGe layer having a second Ge content that is greater than the first Ge content is formed on an exposed topmost surface of the second SiGe layer. In accordance with the present application, the third SiGe layer is compressively strained. The hard mask is thereafter removed from atop the strained silicon layer in the nFET device region. Next, the strained silicon layer in the nFET device region is patterned to provide a strained silicon fin, and a material stack of the third SiGe layer and the second SiGe layer in the pFET device region is also patterned to provide a SiGe fin structure.

In another aspect of the present application, a semiconductor structure is provided. In one embodiment of the present application, the semiconductor structure includes a tensily strained silicon fin extending upwards from a first portion of a substrate and in an nFET device region. The structure further includes a SiGe fin structure extending upwards from a second portion of the substrate and in a pFET device region. In accordance with the present application, the SiGe fin structure comprises, from bottom to top, a lower SiGe fin that is relaxed and an upper SiGe fin, wherein the upper SiGe fin is compressively strained and has a germanium content that is greater than a germanium content of the lower SiGe fin.

DETAILED DESCRIPTION

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Figure 1:
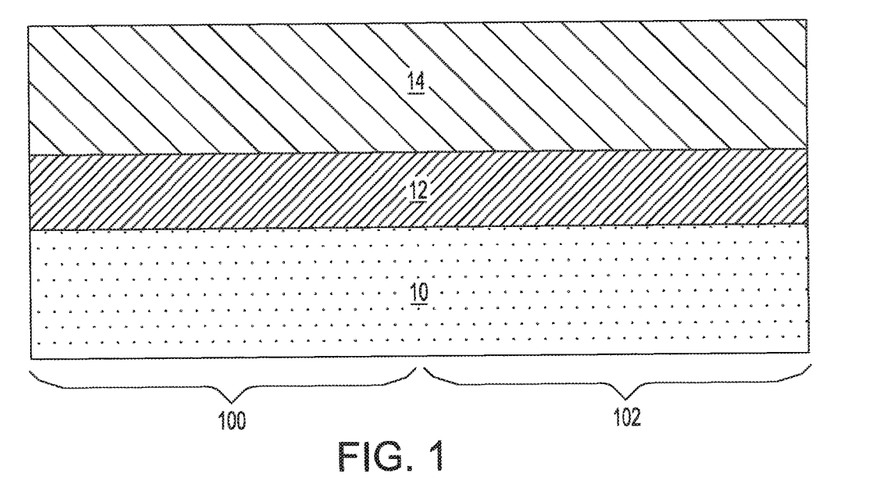
FIG. 1 is a cross sectional view of an exemplary semiconductor structure including, from bottom to top, a handle substrate, an insulator layer and a strained silicon layer that can be employed in one embodiment of the present application.

Referring first to FIG. 1, there is illustrated an exemplary semiconductor structure including, from bottom to top, a handle substrate 10, an insulator layer 12 and a strained silicon layer 14 that can be employed in one embodiment of the present application. Collectively, the handle substrate 10, insulator layer 12 and strained silicon layer 14 may be referred to herein as a strained silicon-on-insulator (SSOI) substrate. The handle substrate 10 provides mechanical support to the insulator layer 12 and the strained silicon layer 14.

In some embodiments of the present application, the handle substrate 10 may comprise a semiconductor material. The term "semiconductor" as used herein in connection with the semiconductor material of the handle substrate 10 denotes any semiconducting material including, for example, Si, Ge, SiGe, SiC, SiGeC, or III/V compound semiconductors such as, for example, InAs, GaAs or InP. Multilayers of these semiconductor materials can also be used as the semiconductor material of the handle substrate 10. In one embodiment, the handle substrate 10 is composed of silicon. In some embodiments, the handle substrate 10 is a non-semiconductor material including, for example, a dielectric material and/or a conductive material. In some embodiments, the handle substrate 10 may be omitted.

The handle substrate 10 and the strained silicon layer 14 may have the same or different crystal orientation. For example, the crystal orientation of the handle substrate 10 and/or the strained silicon layer 14 may be {100}, {110}, or {111}. Other crystallographic orientations besides those specifically mentioned can also be used in the present application. The handle substrate 10 of the SSOI substrate may be a single crystalline semiconductor material, a polycrystalline material, or an amorphous material.

The insulator layer 12 of the SSOI substrate may be a crystalline or non-crystalline oxide or nitride. In one embodiment, the insulator layer 12 is an oxide such as, for example, silicon dioxide. In another embodiment, the insulator layer 12 is a nitride such as, for example, silicon nitride or boron nitride. In yet other embodiments, the insulator layer 12 is a multilayered stack of, in any order, silicon dioxide and boron nitride.

The strained silicon layer 14 of the SSOI substrate is composed of single crystalline silicon. The strained silicon layer 14 of the present application is tensily strained. In one embodiment, the strained silicon layer 14 has a strain value of from 0.5% to 1.5%.

The SSOI substrate may be formed utilizing a layer transfer process. In such a process, an optional thinning step may follow the bonding of two semiconductor wafers together. The optional thinning step reduces the thickness of the strained silicon layer 14 to a layer having a thickness that is more desirable.

In some embodiments, the thickness of strained silicon layer 14 of the SSOI substrate is from 10 nm to 100 nm. Other thicknesses that are lesser than, or greater than, the aforementioned thickness range may also be employed as the thickness of the strained silicon layer 14 in the present application. The insulator layer 12 of the SSOI substrate typically has a thickness from 1 nm to 200 nm. Other thicknesses that are lesser than, or greater than, the aforementioned thickness range may also be used as the thickness of the insulator layer 12. The thickness of the handle substrate 10 of the SSOI substrate is inconsequential to the present application.

Figure 2:
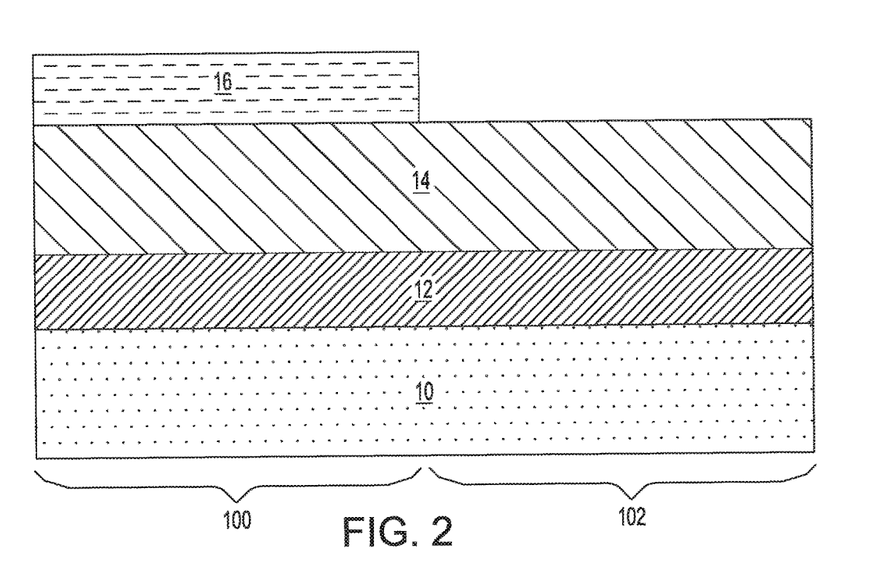
FIG. 2 is a cross sectional view of the exemplary semiconductor structure of FIG. 1 after forming a hard mask on a portion of the strained silicon layer atop an nFET device region, while leaving another portion of the strained silicon layer atop a pFET device region bare.

Referring now to FIG. 2, there is illustrated the exemplary semiconductor structure of FIG. 1 after forming a hard mask 16 on a portion of the strained silicon layer 14 atop an nFET device region 100, while leaving another portion of the strained silicon layer 14 atop a pFET device region 102 bare. The nFET device region 100 is an area of the exemplary semiconductor structure in which at least one nFET device will be subsequently formed, while the pFET device region 102 is an area of the exemplary semiconductor structure in which at least one pFET device will be subsequently formed.

The hard mask 16 can be formed by first forming a contiguous layer of hard mask material (not shown) on a topmost surface of the strained silicon layer 14 of the SSOI substrate shown in FIG. 1. The hard mask material may include a dielectric material such as, for example, silicon dioxide and/or silicon nitride. In one embodiment, the contiguous layer of hard mask material that provides hard mask 16 can be formed utilizing a deposition process such as, for example, chemical vapor deposition or plasma enhanced chemical vapor deposition. In another embodiment of the present application, the contiguous layer of hard mask material that provides hard mask 16 can be formed utilizing a thermal process such as, for example, thermal oxidation or thermal nitridation. The contiguous layer of hard mask material that provides hard mask 16 can have a thickness from 5 nm to 50 nm. Other thicknesses that are lesser than, or greater than, the aforementioned thickness range may also be employed as the thickness of the contiguous layer of hard mask material that provides hard mask 16.

After forming the contiguous layer of hard mask material, the contiguous layer of hard mask material is subjected to a patterning process. In one embodiment of the present application, the contiguous layer of hard mask material can be patterned by lithography and etching. Lithography includes forming a photoresist material (not shown) atop the contiguous layer of hard mask material. The photoresist material may include a positive-tone photoresist composition, a negative-tone photoresist composition or a hybrid-tone photoresist composition. The photoresist material may be formed by a deposition process such as, for example, spin-on coating. After forming the photoresist material, the deposited photoresist material is subjected to a pattern of irradiation. Next, the exposed photoresist material is developed utilizing a conventional resist developer. This provides a patterned photoresist atop a portion of the contiguous layer of hard mask material. The pattern provided by the patterned photoresist material is thereafter transferred into the underlying contiguous layer of hard mask material utilizing at least one pattern transfer etching process. Typically, the at least one pattern transfer etching process is an anisotropic etch. In one embodiment, a dry etching process such as, for example, reactive ion etching can be used. In another embodiment, a chemical etchant can be used. In still a further embodiment, a combination of dry etching and wet etching can be used.

Figure 3:
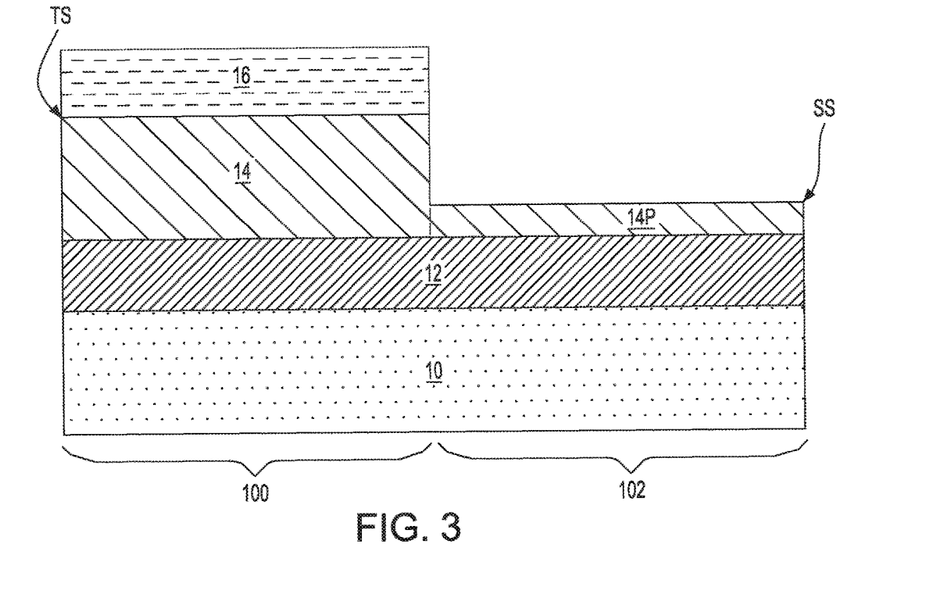
FIG. 3 is a cross sectional view of the exemplary semiconductor structure of FIG. 2 after recessing the strained silicon layer in the pFET device region to expose a sub-surface of a remaining portion of the strained silicon layer.

Referring now to FIG. 3, there is illustrated the exemplary semiconductor structure of FIG. 2 after recessing the strained silicon layer 14 in the pFET device region 102 to expose a sub-surface SS of a remaining portion of the strained silicon layer 14. The remaining portion of strained silicon layer 14 within the pFET device region 102 may be referred to herein as a strained silicon portion 14P.

As is shown, the strained silicon portion 14P within the pFET device region 102 has a thickness that is less than the thickness of strained silicon layer 14 within the nFET device region 100. Thus, the exposed sub-surface SS of the strained silicon portion 14P within the pFET device region 102 is vertically offset and is located beneath a topmost surface TS of the strained silicon layer 14 in the nFET device region 100. In one example, the thickness of the strained silicon layer 14 within the nFET device region 100 is 30 nm, while the thickness of the strained silicon portion 14P in the pFET device region 102 is 5 nm.

The recessing of the strained silicon layer 14 in the pFET device region 102 may be performed utilizing an anisotropic etching process such as, for example, reactive ion etching, that selectively removes silicon as compared to a dielectric material that provides hard mask 16. In one example, reactive ion etching (RIE) may be used to recess that strained silicon layer 14 that is not protected by hard mask 16.

Figure 4:
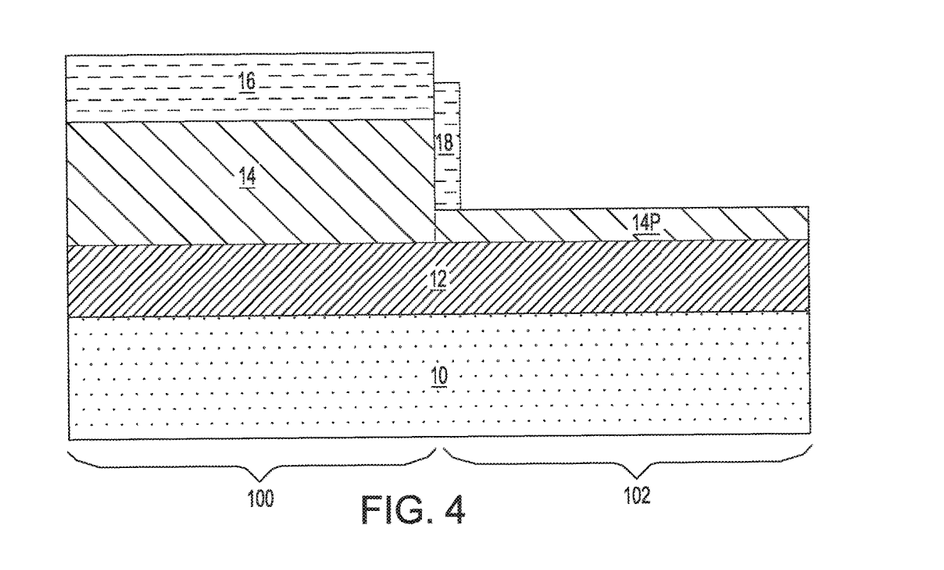
FIG. 4 is a cross sectional view of the exemplary semiconductor structure of FIG. 3 after forming a dielectric spacer.

Referring now to FIG. 4, there is illustrated the exemplary semiconductor structure of FIG. 3 after forming a dielectric spacer 18. In some embodiments, dielectric spacer 18 formation may be omitted. When dielectric spacer 18 is formed, it is formed along an exposed sidewall surface of the strained silicon layer 14 within the nFET device region 100. A base of the dielectric spacer 18 is formed on a portion of the exposed sub-surface SS of strained silicon portion 14P in the pFET device region 102. In some embodiments and as shown, a topmost surface of the dielectric spacer 18 is positioned between a topmost surface of the hard mask 16 and a bottommost surface of the hard mask 16. As such, the dielectric spacer 18 may also be formed along a sidewall surface of the hard mask 16. In yet other embodiments, the dielectric spacer 18 may have a topmost surface that is coplanar with either a topmost surface of the hard mask 16, or the topmost surface TS of the strained silicon layer 14 in the nFET device region 100.

The dielectric spacer 18 may comprise a same or different dielectric material as the hard mask material that provides the hard mask 16. In one embodiment, dielectric spacer 18 may comprise silicon dioxide, silicon nitride and/or silicon oxynitride. The dielectric spacer 18 may be formed by deposition of a dielectric spacer material and thereafter subjecting the deposited dielectric spacer material to a spacer etch.

Figure 5:
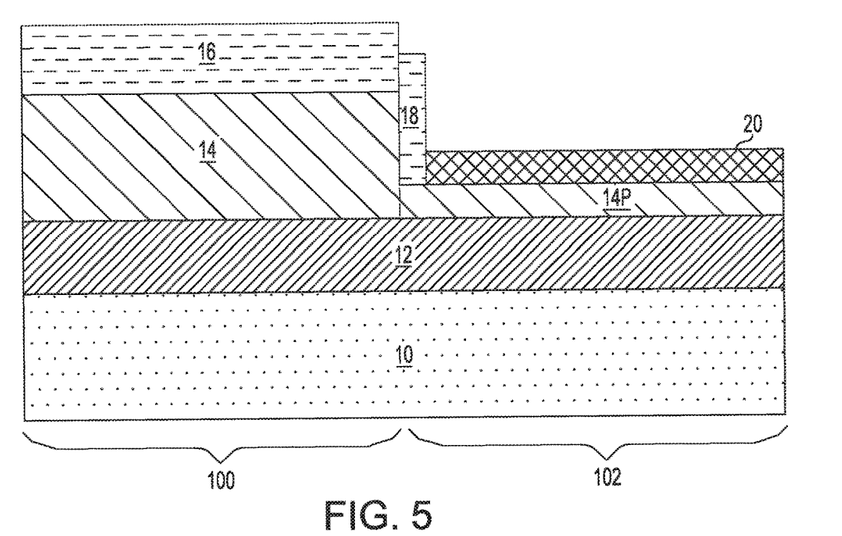
FIG. 5 is a cross sectional view of the exemplary semiconductor structure of FIG. 4 after forming a first SiGe layer having a first Ge content on the exposed sub-surface of the remaining portion of the strained silicon layer within the pFET device region.

Referring now to FIG. 5, there is illustrated the exemplary semiconductor structure of FIG. 4 after forming a first SiGe layer 20 having a first Ge content on the exposed sub-surface SS of the remaining portion of the strained silicon layer (i.e., strained silicon portion 14P) within the pFET device region 102.

The first SiGe layer 20 may be formed by a selective epitaxial growth (or deposition) process; by "selective" it is meant that first SiGe layer 20 forms only on exposed surfaces of semiconductor material, i.e., the exposed sub-surface SS of the strained silicon portion 14P, and not on dielectric surfaces, such as silicon dioxide or silicon nitride surfaces. The terms "epitaxial growth and/or deposition" and "epitaxially formed and/or grown" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. Thus, the first SiGe layer 20 has an epitaxial relationship with the growth surface of the underlying strained silicon portion 14P.

Examples of various epitaxial growth process apparatuses that are suitable for use in forming the first SiGe layer 20 of the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition ranges from 550° C. to 900° C. Although higher temperature typically results in faster deposition, the faster deposition may result in crystal defects and film cracking.

A number of different sources may be used for the deposition of the first SiGe layer 20. In some embodiments, the gas source for the deposition of the first SiGe layer 20 may include an admixture of a silicon containing gas source and a germanium containing gas source. Examples of silicon gas sources include silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. Examples of germanium gas sources include germane, digermane, halogermane, dichlorogermane, trichlorogermane, tetrachlorogermane and combinations thereof. In some embodiments, the first SiGe layer 20 can be formed from a source gas that includes a compound containing silicon and germanium. Carrier gases like hydrogen, nitrogen, helium and argon can be used.

As mentioned above, the first SiGe layer 20 has a first Ge content. In one embodiment of the present application, the first Ge content of the first SiGe layer 20 can be from 20 atomic percent germanium to 50 atomic percent germanium. The first SiGe layer 20 that is formed has a thickness that is substantially the same as the thickness of strained silicon portion 14P. By "substantially the same" it is meant that the thickness of the first SiGe layer 20 is within ±1 nm from the thickness of the underlying strained silicon portion 14P.

Figure 6:
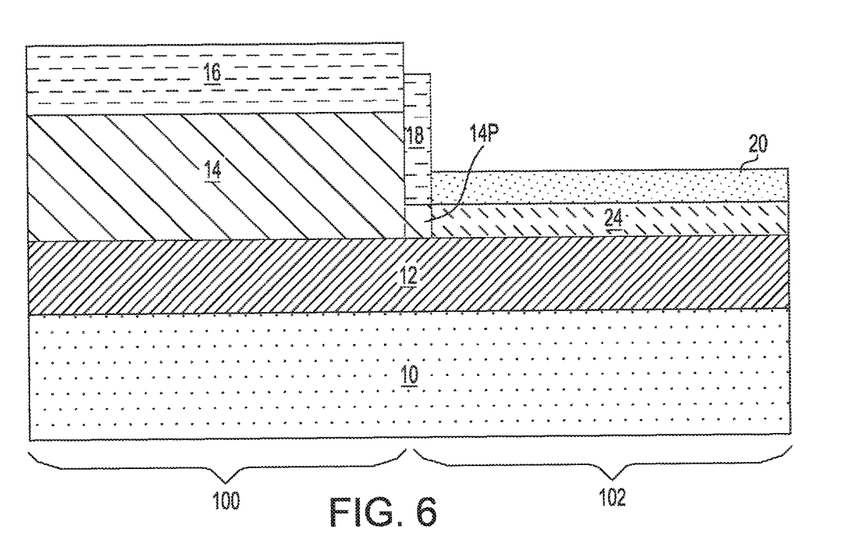
FIG. 6 is a cross sectional view of the exemplary semiconductor structure of FIG. 5 after performing a thermal condensation which converts a remaining portion of the strained silicon layer in the pFET device region into a second SiGe layer having the first Ge content.

Referring now to FIG. 6, there is illustrated the exemplary semiconductor structure of FIG. 5 after performing a thermal condensation which converts a remaining portion of the strained silicon layer (i.e., strained silicon portion 14P) in the pFET device region 102 into a second SiGe layer 24 having the first germanium content. During the thermal condensation, the entirety of the first SiGe layer 20 is consumed and a silicon oxide layer 22 forms on the second SiGe layer 24. Notably, during thermal condensation, Si atoms within the first SiGe layer 20 react with oxygen forming silicon oxide layer 22 and Ge atoms from the first SiGe layer 22 diffuse downwards into the strained silicon portion 14P converting the strained silicon portion 14P into the second SiGe layer 24.

The thermal condensation can be performed in an oxidizing ambient such as, for example, oxygen, air, ozone, water vapor, and/or $NO_2$. In some embodiments, the oxidizing ambient can be admixed with an inert gas such as, for example, He, Ar and/or Ne. In such an embodiment, the inert gas constitutes from 2 volume % to 95 volume % of an oxidizing ambient containing admixture. The thermal condensation can be performed at a temperature from 400° C. to 1300° C. The thermal condensation may include a furnace anneal, a rapid thermal anneal or any other anneal that can provide the exemplary semiconductor structure shown in FIG. 6.

The second SiGe layer 24 that is formed is a relaxed SiGe layer; the strained silicon layer 14 within the nFET device region 100 remains strained after the thermal condensation process. The second SiGe layer 24 that is formed has substantially the same thickness as that of the strained silicon portion 14P. The second SiGe layer 24 that is formed after thermal condensation has a bottommost surface that is in direct physical contact with a portion of the insulator layer 12. The second SiGe layer 24 that is formed after thermal condensation also has a sidewall surface that directly contacts a portion of the strained silicon portion 14P that remains beneath the dielectric spacer 18.

Figure 7:
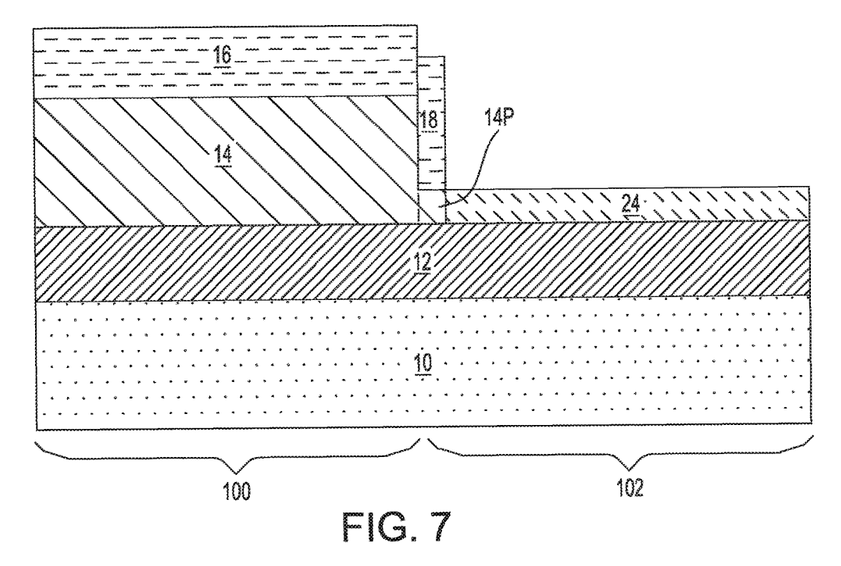
FIG. 7 is a cross sectional view of the exemplary semiconductor structure of FIG. 6 after exposing a topmost surface of the second SiGe layer within the pFET device region.

Referring now to FIG. 7, there is illustrated the exemplary semiconductor structure of FIG. 6 after exposing a topmost surface of the second SiGe layer 24 within the pFET device region 102. The exposing of the topmost surface of the second SiGe layer 24 includes removing the silicon oxide layer 22 that is formed during thermal condensation. The removal of the silicon oxide layer 22 may comprise an etching process that is selective in removing silicon oxide as compared with the underlying second SiGe layer 24.

Figure 8:
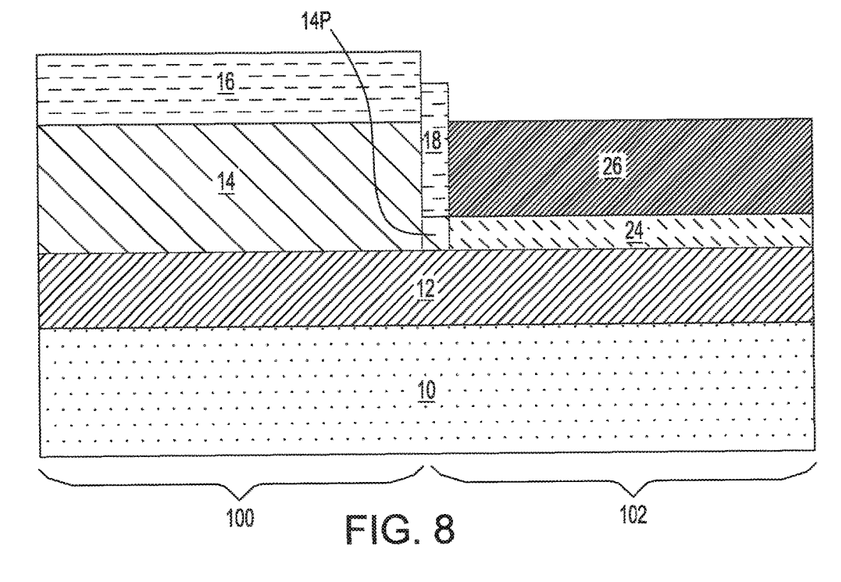
FIG. 8 is a cross sectional view of the exemplary semiconductor structure of FIG. 7 after forming a third SiGe layer having a second Ge content that is greater than the first Ge content on the topmost surface of the second SiGe layer.

Referring now to FIG. 8, there is illustrated the exemplary semiconductor structure of FIG. 7 after forming a third SiGe layer 26 having a second Ge content that is greater than the first Ge content on the topmost surface of the second SiGe layer 24. The third SiGe layer 26 that is formed has a topmost surface that is coplanar with a topmost surface of the strained silicon layer 14 that is within the nFET device region 100. In the illustrated embodiment, the third SiGe layer 26 that is formed has a sidewall surface that directly contacts a sidewall surface of the dielectric spacer 18. Also, and in the illustrated embodiment, a bottommost surface of the third SiGe layer 26 is coplanar with a bottommost surface of the dielectric spacer 18.

The third SiGe layer 26 may be formed utilizing an epitaxial growth (or deposition) process as mentioned above in forming the first SiGe layer 20. Thus, the third SiGe layer 26 that is formed has an epitaxial relationship, i.e., same crystal orientation, as the growth surface of the second SiGe layer 24 that is formed by thermal condensation.

As mentioned above, the third SiGe layer 26 has a second Ge content that is greater than the first Ge content. In one embodiment of the present application, the second Ge content of the third SiGe layer 26 can be from 30 atomic percent germanium to 70 atomic percent germanium. In one embodiment, of the present application, the third SiGe layer 26 that is formed has a thickness from 20 nm to 50 nm. Other thicknesses are possible for the third SiGe layer 26. The third SiGe layer 26 that is formed is thus compressively strained.

Figure 9:
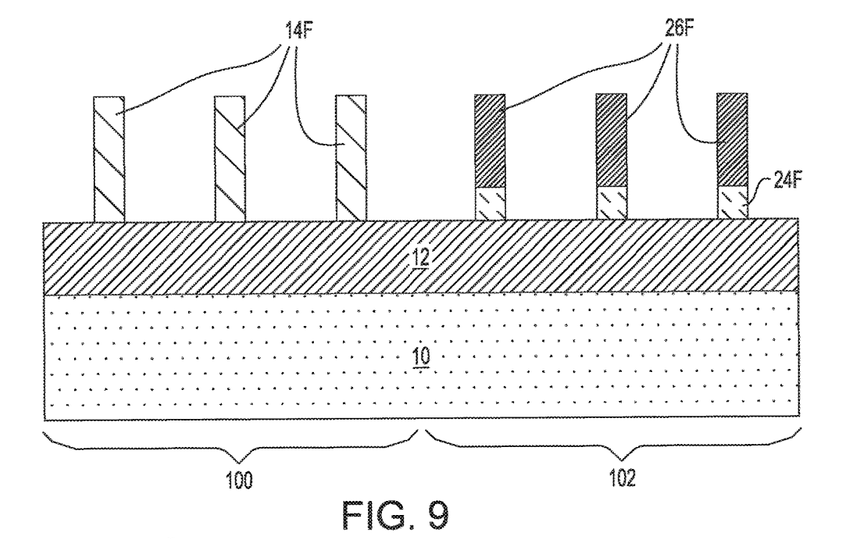
FIG. 9 is a cross sectional view of the exemplary semiconductor structure of FIG. 8 after removing the hard mask, and forming strained silicon fins in the nFET device region, and forming SiGe fin structures comprising, from bottom to top, a lower SiGe fin having the first Ge content and an upper SiGe fin having the second Ge content and being compressively strained.

Referring now to FIG. 9, there is illustrated the exemplary semiconductor structure of FIG. 8 after removing the hard mask 16, and forming strained silicon fins 14F in the nFET device region 100, and forming SiGe fin structures comprising, from bottom to top, a lower SiGe fin 24F having the first Ge content and an upper SiGe fin 26F having the second Ge content and being compressively strained.

Although a plurality of strained silicon fins 14F and a plurality of SiGe fin structures (24F, 26F) is described and illustrated, the present application contemplates an embodiment in which a single strained silicon fin 14F and/or a single SiGe fin structure (24F, 26F) is/are formed.

Each strained silicon fin 14F within the nFET device region 100 comprises a remaining portion of strained silicon layer 14. Thus, each strained silicon fin 14 is tensily strained and has a height that is the same as the original thickness of the strained silicon layer 14. Each strained silicon fin 14F has a bottommost surface that is located on a portion of a topmost surface of insulator layer 12.

Each SiGe fin structure (24F, 26F) within the pFET device region 102 comprises a remaining portion of second SiGe layer 24 and a remaining portion of the third SiGe layer 26. Namely, the lower SiGe fin 24F comprises a remaining portion of the second SiGe layer 24 and thus is relaxed, while the upper SiGe fin 26F comprises a remaining portion of the third SiGe layer 26 and thus is compressively strained. Each SiGe fin structure (24F, 26F) has a topmost surface that is coplanar with a topmost surface of each strained silicon fin 14F. Namely, the topmost surface of each upper SiGe fin 26F is coplanar with a topmost surface of each strained silicon fin 14. As such, each strained silicon 14F and each SiGe fin structure (24F, 26F) have a same height. As is shown, each lower SiGe fin 24F has a thickness that is less than a thickness of a corresponding and overlying upper SiGe fin 26F.

As is shown, a bottommost surface of each lower SiGe fin 24F is in direct physical contact with a portion of the underlying insulator layer 12. The bottommost surface of each upper SiGe fin 26F is located on a topmost surface of a corresponding and underlying lower SiGe fin 24F. Each upper SiGe fin 26F has sidewall surfaces that are vertically coincident (i.e., not extending beyond or undercutting) sidewall surfaces of a corresponding and underlying lower SiGe fin 24F.

The hard mask 16 can be removed utilizing any process that can selectively remove the hard mask material that provides hard mask 16. In some embodiments, the dielectric spacer 22 may also be removed at the same time as the removal of the hard mask 16. In yet another embodiment, the dielectric spacer 22 can be removed after hard mask 16 removal and prior to forming the strained silicon fins 14F and the SiGe fin structures (24F, 26F).

The strained silicon fins 14F and the SiGe fin structures (24F, 26F) can be formed by patterning the strained silicon layer 14 within the nFET device region 100 and the material stack of, from bottom to top, the second SiGe layer 24 and the third SiGe layer 26 in the pFET device region 102. The patterning of the strained silicon layer 14 may occur prior to, simultaneously with, or after the patterning of a material stack comprising the third SiGe layer 26 and the second SiGe layer 24.

In one embodiment of the present application, lithography and etching as defined above may be used to provide the strained silicon fins 14F and the SiGe fin structures (24F, 26F).

In another embodiment of the present application, a sidewall image transfer (SIT) process may be used to provide the strained silicon fins 14F and the SiGe fin structures (24F, 26F). The SIT process includes forming a contiguous mandrel material layer (not shown) atop the strained stain layer 14 and the third SiGe layer 26. The contiguous mandrel material layer (not shown) can include any material (semiconductor, dielectric or conductive) that can be selectively removed from the structure during a subsequently performed etching process. In one embodiment, the contiguous mandrel material layer (not shown) may be composed of amorphous silicon or polysilicon. In another embodiment, the contiguous mandrel material layer (not shown) may be composed of a metal such as, for example, Al, W, or Cu. The contiguous mandrel material layer (not shown) can be formed, for example, by chemical vapor deposition or plasma enhanced chemical vapor deposition. Following deposition of the contiguous mandrel material layer (not shown), the contiguous mandrel material layer (not shown) can be patterned by lithography and etching to form a plurality of mandrel structures (also not shown) on the topmost surface of the structure.

The SIT process continues by forming a dielectric spacer on each sidewall of each mandrel structure. The dielectric spacer can be formed by deposition of a dielectric spacer material and then etching the deposited dielectric spacer material. The dielectric spacer material may comprise any dielectric spacer material such as, for example, silicon dioxide, silicon nitride or a dielectric metal oxide. Examples of deposition processes that can be used in providing the dielectric spacer material include, for example, chemical vapor deposition (CVD), plasma enhanced chemical vapor deposition (PECVD), or atomic layer deposition (ALD). Examples of etching that be used in providing the dielectric spacers include any etching process such as, for example, reactive ion etching.

After formation of the dielectric spacers, the SIT process continues by removing each mandrel structure. Each mandrel structure can be removed by an etching process that is selective for removing the mandrel material. Following the mandrel structure removal, the SIT process continues by transferring the pattern provided by the dielectric spacers into the underlying semiconductor materials stopping atop the insulator layer 12. The pattern transfer may be achieved by utilizing at least one etching process. Examples of etching processes that can used to transfer the pattern may include dry etching (i.e., reactive ion etching, plasma etching, and ion beam etching or laser ablation) and/or a chemical wet etch process. In one example, the etch process used to transfer the pattern may include one or more reactive ion etching steps. Upon completion of the pattern transfer, the SIT process concludes by removing the dielectric spacers from the structure. Each dielectric spacer may be removed by etching or a planarization process.

Each strained silicon fin 14F and each SiGe fin structure (24F, 26F) that are formed include a pair of vertical sidewalls that are parallel to each other. As used herein, a surface is "vertical" if there exists a vertical plane from which the surface does not deviate by more than three times the root mean square roughness of the surface. Each strained silicon fin 14F and each SiGe fin structure (24F, 26F) have a width (i.e., the first width) from 12 nm to 40 nm and a length from 100 nm to 2000 nm. Other widths and lengths are possible and can be used in the present application for the strained silicon fins 14F and SiGe fin structures (24F, 26F).

Figure 10:
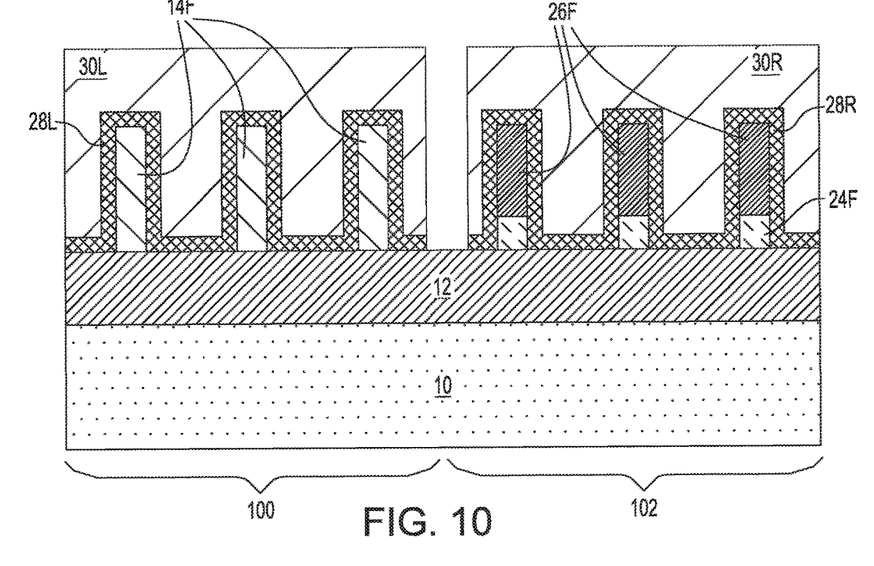
FIG. 10 is a cross sectional view of the exemplary semiconductor structure of FIG. 9 after forming an nFET gate structure straddling over each strained silicon fin, and a pFET gate structure straddling over each SiGe fin structure.

Referring now to FIG. 10, there is illustrated the exemplary semiconductor structure of FIG. 9 after forming an nFET gate structure straddling over each strained silicon fin 14F, and a pFET gate structure straddling over each SiGe fin structure (24F, 26F). By "straddling" it is meant that at least one portion of the gate structure is located on one side of strained silicon fin 14F or SiGe fin structure (24F, 26F), while another portion of the same gate structure is located on another side of the strained silicon fin 14F or the SiGe fin structure (24F, 26F). The two portions are interconnected by a portion of the gate structure that is located directly atop of the strained silicon fin 14F or the SiGe fin structure (24F, 26F). As shown in the illustrated embodiment, a portion of the gate structure contacts a topmost surface of insulator layer 12. Although a single gate structure is described and illustrated, a plurality of gate structures can be formed straddling different portions of the strained silicon fin 14F and/SiGe fin structure (24F, 26F).

In one embodiment (and as shown), each gate structure (i.e., nFET gate structure and FET structure) is a functional gate structure. By "functional gate structure" it is meant a permanent gate structure used to control output current (i.e., flow of carriers in the channel) of a semiconducting device through electrical or magnetic fields. Each functional gate structure includes a gate material stack of, from bottom to top, a gate dielectric portion 28L, 28R and a gate conductor portion 30L, 30R. In some embodiments, a gate cap portion (not shown) can be present atop each gate conductor portion 30L, 30R.

Each gate dielectric portion 28L, 28R of the functional gate structure comprises a gate dielectric material. The gate dielectric material that provides each gate dielectric portion 28L, 28R can be an oxide, nitride, and/or oxynitride. In one example, the gate dielectric material that provides each gate dielectric portion 28L, 28R can be a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon dioxide, and a high-k gate dielectric, can be formed and used as each gate dielectric portion 28L, 28R. In some embodiments, gate dielectric portion 28L comprises a same gate dielectric material as gate dielectric portion 28R. In other embodiments, gate dielectric portion 28L comprises a different gate dielectric material than gate dielectric portion 28R.

The gate dielectric material used in providing each gate dielectric portion 28L, 28R can be formed by any deposition process including, for example, chemical vapor deposition (CVD), plasma enhanced chemical vapor deposition (PECVD), physical vapor deposition (PVD), sputtering, or atomic layer deposition. In some embodiments and when different gate dielectric materials are used in providing the gate dielectric portions 28L, 28R, block mask technology can be used. In one embodiment of the present application, the gate dielectric material used in providing each gate dielectric portion 28L, 28R can have a thickness in a range from 1 nm to 10 nm. Other thicknesses that are lesser than, or greater than, the aforementioned thickness range can also be employed for the gate dielectric material.

Each gate conductor portion 30L, 30R of the functional gate structure comprises a gate conductor material. The gate conductor material used in providing each gate conductor portion 30L, 30R can include any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) or multilayered combinations thereof. In some embodiments, the gate conductor portion 30L comprise a same conductive material as gate conductor portion 30R. In other embodiments, the gate conductor portion 30L comprises a different gate conductor material than gate conductor portion 30R. For example, the gate conductor portion 30L may comprise an nFET gate metal, while the gate conductor portion 30R may comprise a pFET gate metal.

The gate conductor material used in providing each gate conductor portion 30L, 30R can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. When a metal silicide is formed, a conventional silicidation process is employed. When a different gate conductor material is used for each gate conductor portion 30L, 30R, block mask technology can be used. In one embodiment, the gate conductor material used in providing each gate conductor portion 30L, 30R has a thickness from 1 nm to 100 nm. Other thicknesses that are lesser than, or greater than, the aforementioned thickness range can also be employed for the gate conductor material used in providing each gate conductor portion 30L, 30R.

If present, the gate cap portion of the functional gate structure comprises a gate cap material. The gate cap material that provides the gate cap portion may include one of the hard mask materials mentioned above. In one embodiment, each gate cap portion comprises silicon dioxide, silicon nitride, and/or silicon oxynitride. The material that provides the gate cap portion can be formed utilizing a conventional deposition process such as, for example, chemical vapor deposition or plasma enhanced chemical vapor deposition. The material that provides the gate cap portion can has a thickness from 5 nm to 20 nm. Other thicknesses that are lesser than, or greater than, the aforementioned thickness range can also be employed as the thickness of the material that provides the gate cap portion.

The functional gate structure can be formed by providing a functional gate material stack of, from bottom to top, the gate dielectric material, the gate conductor material and, if present, the gate cap material. The gate material stack can then be patterned. In one embodiment of the present application, patterning of the functional gate material stack may be performed utilizing lithography and etching, as defined above.

In other embodiments of the present application, and prior to forming functional gate structure, a sacrificial gate structure is formed instead of a functional gate structure. In yet other embodiments and when multiple gate structures are formed, at least one of the gate structures is a functional gate structure, and at least one other of the gate structures is a sacrificial gate structure. By "sacrificial gate structure" it is meant a material or material stack that serves as a placeholder for a subsequently formed functional gate structure. In such a process, the functional gate structure is formed after the source/drain regions have been formed. In such an embodiment, the gate dielectric portion of the functional gate structure that replaces the sacrificial gate structure may be U-shaped. By "U-shaped" it is meant a material that includes a bottom horizontal surface and a sidewall surface that extends upward from the bottom horizontal surface. When employed, each sacrificial gate structure may include a sacrificial gate dielectric portion, a sacrificial gate material portion and a sacrificial gate cap portion. In some embodiments, each sacrificial gate dielectric portion and/or each sacrificial gate cap portion may be omitted. Each sacrificial gate dielectric portion includes one of the dielectric materials mentioned above for the gate dielectric portion. Each sacrificial gate material portion includes one of the gate conductor materials mentioned above for the gate conductor portion. The sacrificial gate cap portion includes one of the gate cap materials mentioned above for each gate cap portion. The sacrificial gate structures can be formed by deposition of the various material layers and then patterning the resultant sacrificial dielectric material sack by utilizing, for example, lithography and etching.

After forming the gate structures (functional and/or sacrificial gate structures), dielectric spacers (not shown) can be formed on exposed sidewall surfaces of the respective gate structure. The dielectric spacers may comprise one of the dielectric materials mentioned above for dielectric spacers used in the SIT process. The dielectric spacers can be formed by depositing a spacer material and thereafter a spacer etch can be performed. Next, a source region (not shown) is formed on one side of each gate structure and a drain region (not shown) is formed on another side of each gate structure. The source region and the drain region would run into an out of the plane of the paper including the exemplary semiconductor structure shown in FIG. 10. The source/drain regions may including formation of a doped epitaxial semiconductor material on exposed portions of each strained silicon fin 14F and exposed portions of each SiGe fin structure (24F, 26F).

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
   a tensily strained silicon fin extending upwards from a first portion of a substrate and in an nFET device region; and
   a SiGe fin structure extending upwards from a second portion of said substrate and in a pFET device region, wherein said SiGe fin structure comprises, from bottom to top, a lower SiGe fin that is relaxed and an upper SiGe fin, wherein said upper SiGe fin of said SiGe fin structure is compressively strained and has a germanium content that is greater than a germanium content of said lower SiGe fin of said SiGe fin structure.

2. The semiconductor structure of claim 1, wherein a topmost surface of said tensily strained silicon fin is coplanar with a topmost surface of said upper SiGe fin of said SiGe fin structure.

3. The semiconductor structure of claim 1, wherein a bottommost surface of said upper SiGe fin of said SiGe fin structure is in direct physical contact with a topmost surface of said lower SiGe fin of said SiGe fin structure.

4. The semiconductor structure of claim 1, wherein said upper SiGe fin of said SiGe fin structure has a thickness that is greater than a thickness of said lower SiGe fin of said SiGe fin structure.

5. The semiconductor structure of claim 1, wherein said upper SiGe fin of said SiGe fin structure has sidewall surfaces that are vertically coincident with sidewall surfaces of said lower SiGe fin of said SiGe fin structure.

6. The semiconductor structure of claim 1, wherein said substrate is an insulator layer.

7. The semiconductor structure of claim 1, further comprising an nFET gate structure straddling over said tensily strained silicon fin, and a pFET gate structure straddling over said SiGe fin structure.

8. The semiconductor structure of claim 7, wherein said nFET gate structure and said pFET gate structure comprise a gate dielectric portion and a gate conductor portion.

9. The semiconductor structure of claim 8, wherein said gate conductor portion of said nFET gate structure comprises an nFET gate metal, and said gate conductor portion of said pFET gate structure comprises a pFET gate metal.

10. The semiconductor structure of claim 7, wherein said nFET gate structure and said pFET gate structure are spaced apart from each other.

11. The semiconductor structure of claim 1, wherein a bottommost surface of said tensily strained silicon fin is coplanar with a bottommost surface of said lower SiGe fin of said SiGe fin structure.

12. The semiconductor structure of claim 1, wherein said tensily strained silicon fin has a strain value of from 0.5% to 1.5%.

13. The semiconductor structure of claim 1, wherein germanium content of said upper SiGe fin of said SiGe fin structure is from 30 atomic percent germanium to 70 atomic percent germanium.

14. The semiconductor structure of claim 1, wherein said tensily strained silicon fin and said SiGe fin structure have a same width and a same length.

15. The semiconductor structure of claim 14, wherein said width is from 12 nm to 40 nm, and said length is from 100 nm to 2000 nm.

16. The semiconductor structure of claim 1, wherein said upper SiGe fin of said SiGe fin structure has an epitaxial relationship with said lower SiGe fin of said SiGe fin structure.

17. The semiconductor structure of claim 1, wherein said nFET device region comprises a plurality of said tensily strained silicon fins, and wherein said pFET device region comprises a plurality of said SiGe fin structures.

* * * * *